(12) United States Patent
Kim et al.

(10) Patent No.: US 8,318,560 B2
(45) Date of Patent: Nov. 27, 2012

(54) METHODS OF FORMING INTEGRATED CIRCUIT DEVICES INCLUDING A CAPACITOR

(75) Inventors: Wan-Don Kim, Gyeonggi-do (KR); Cha-Young Yoo, Gyeonggi-do (KR); Suk-Jin Chung, Gyeonggi-do (KR); Jin-Yong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 717 days.

(21) Appl. No.: 11/680,148

(22) Filed: Feb. 28, 2007

(65) Prior Publication Data

US 2007/0207587 A1    Sep. 6, 2007

(30) Foreign Application Priority Data

Mar. 3, 2006    (KR) .................................. 2006-20308

(51) Int. Cl.
*H01L 21/8242*    (2006.01)
(52) U.S. Cl. ................. 438/253; 438/396; 257/E21.649
(58) Field of Classification Search .......... 438/253–256, 438/396–399, 3; 257/E21.649
See application file for complete search history.

(56) References Cited

U.S. PATENT DOCUMENTS

| | | | |
|---|---|---|---|
| 6,580,111 B2 * | 6/2003 | Kim et al. ...................... | 257/301 |
| 2002/0102791 A1 | 8/2002 | Kurasawa et al. | |
| 2003/0107073 A1 * | 6/2003 | Iijima et al. .................... | 257/296 |
| 2003/0142458 A1 * | 7/2003 | Joo et al. ........................ | 361/302 |
| 2003/0153146 A1 * | 8/2003 | Won et al. ...................... | 438/253 |
| 2003/0160275 A1 * | 8/2003 | Nakamura ...................... | 257/309 |
| 2004/0108534 A1 * | 6/2004 | Tsunomura et al. ........... | 257/300 |
| 2006/0073615 A1 * | 4/2006 | Yang ................................ | 438/3 |
| 2007/0004194 A1 * | 1/2007 | Cho et al. ....................... | 438/624 |
| 2007/0108493 A1 * | 5/2007 | Iijima ............................. | 257/308 |

FOREIGN PATENT DOCUMENTS

| | | |
|---|---|---|
| JP | 2000068471 A | 3/2000 |
| JP | 2002231901 A | 8/2002 |
| KR | 10-0192064 B1 | 11/1991 |
| KR | 020010106713 A | 12/2001 |
| KR | 1020020064135 A | 8/2002 |
| KR | 1020030097492 A | 12/2003 |
| KR | 10-0659026 B1 | 10/2004 |

OTHER PUBLICATIONS

Notice of Allowance for Korean Patent Application No. 10-2006-0020308; Sep. 10, 2007.
English translation of Notice of Allowance for Korean Patent Application No. 10-2006-0020308; Sep. 10, 2007.

* cited by examiner

*Primary Examiner* — H. Jey Tsai
(74) *Attorney, Agent, or Firm* — Myers Bigel Sibley & Sajovec, P.A.

(57) ABSTRACT

Methods of forming a capacitor of an integrated circuit device include forming a lower electrode of the capacitor on an integrated circuit substrate without exposing a contact plug to be coupled to the lower electrode. A supporting conductor is formed coupling the lower electrode to the contact plug after forming the lower electrode. A capacitor dielectric layer is formed on the lower electrode and an upper electrode of the capacitor is formed on the capacitor dielectric layer.

11 Claims, 9 Drawing Sheets

METHODS OF FORMING INTEGRATED CIRCUIT DEVICES INCLUDING A CAPACITOR

CROSS-REFERENCE TO RELATED APPLICATION

This application is related to and claims priority under 35 U.S.C. §119 from Korean Patent Application No. 10-2006-0020308, filed on Mar. 3, 2006, in the Korean Intellectual Property Office, the disclosure of which is incorporated herein by reference in its entirety.

BACKGROUND OF THE INVENTION

The present invention relates to integrated circuit devices and, more particularly, to integrated circuit devices including a capacitor and methods of forming the same.

A capacitor formed in an integrated circuit device generally includes a dielectric layer sandwiched between two electrodes. Capacitors may be used in integrated circuit devices such as memory devices, analog devices including a RF device, mixed mode signal devices, system drivers and/or the like. Such capacitors typically require a specified capacitance to assure reliable operation in the respective applications. As the integration density of an integrated circuit device increases, however, the area occupied by a capacitor is typically reduced, which may reduce the capacitance of the capacitor. As such, various approaches have been proposed to form a capacitor with a high capacitance in a given area.

Typically, mono-crystalline silicon or polycrystalline silicon has been used as an electrode material for the capacitor. Mono-crystalline or polycrystalline silicon generally has an inherently limited ability to reduce a resistance of the electrode due to material characteristics of the silicon material. Additionally, a depletion region is typically generated in mono-crystalline or polycrystalline silicon electrode when a bias voltage is applied thereto, which may change the capacitance of a capacitor.

In an attempt to address these limitations associated with mono-crystalline or polycrystalline silicon electrode, it has been proposed to form a capacitor with a metal electrode. However, in forming a metal electrode, a temperature of about 600° C. may be required during processing, which may result in oxidization of other structures of the capacitor. As a result, a contact resistance may be raised and capacitance of the capacitor may be reduced.

SUMMARY OF THE INVENTION

Some embodiments of the present invention provide methods of forming a capacitor of an integrated circuit device including forming a lower electrode of the capacitor on an integrated circuit substrate without exposing a contact plug to be coupled to the lower electrode. A supporting conductor is formed coupling the lower electrode to the contact plug after forming the lower electrode. A capacitor dielectric layer is formed on the lower electrode and an upper electrode of the capacitor is formed on the capacitor dielectric layer.

In other embodiments, forming the lower electrode includes forming a lower insulating layer on the substrate and forming a contact hole through the lower insulating layer. The contact plug is formed in the contact hole. An upper insulating layer is formed on the lower insulating layer including the contact plug and an opening is formed in the upper insulating layer over the contact plug without exposing the contact plug. The lower electrode is formed on sidewalls of the opening in the upper insulating layer and the contact plug is exposed by extending the opening in the upper insulating layer after forming the lower electrode.

In further embodiments, forming the supporting conductor includes forming the supporting conductor in the opening in the upper insulating layer and contacting the lower electrode and the exposed contact plug. Forming the supporting conductor in the opening in the second insulating layer may include conformally depositing a conductive layer in the opening in the upper insulating layer to form the supporting conductor. In some embodiments, forming the supporting conductor in the opening includes either filling the opening in the upper insulating layer with a conductive material to form the supporting conductor in the opening or conformally depositing a layer of a conductive material in the opening leaving an unfilled remaining region of the opening and then filling the remaining region.

In yet further embodiments, forming the upper insulating layer includes forming a first upper insulating layer on the lower insulating layer and forming a second upper insulating layer on the first upper insulating layer. Forming the opening in the upper insulating layer without exposing the contact plug includes forming the opening in the second upper insulating layer and exposing the first upper insulating layer. Exposing the contact plug includes extending the opening in the second upper insulating layer through the first upper insulating layer to expose the contact plug.

In other embodiments, forming the capacitor dielectric layer is preceded by forming an additional lower electrode portion covering an upper surface of the supporting conductor. The additional lower electrode portion is a different material than the supporting conductor. Forming the capacitor dielectric layer includes forming the capacitor dielectric layer on the additional lower electrode portion. Forming a supporting conductor may include forming the supporting conductor to a height lower than an upper surface of the lower electrode to provide an electrode space and forming the additional lower electrode portion may include forming the additional lower electrode portion in the electrode space and contacting the lower electrode formed on the sidewalls of the opening in the upper insulating layer.

In further embodiments, the capacitor is located in a cell area of the integrated circuit device and the integrated circuit device also includes a peripheral area. Forming the supporting conductor to a height lower than an upper surface of the lower electrode includes depositing a material layer of the material of the additional lower electrode portion on the upper insulating layer and the supporting conductor in the cell area and on an insulating layer in the peripheral area. A thickness of the material layer is less on the cell area than on the peripheral area. The deposited material layer is etched back to expose the insulating layer of the peripheral area and the upper insulating layer in the cell area and to form the electrode space.

In yet other embodiments, forming the supporting conductor to a height lower than an upper surface of the lower electrode includes depositing a material layer of the material of the supporting conductor on the upper insulating layer and the supporting conductor. The deposited material layer is polished to expose the upper insulating layer and then the polished supporting conductor is etched to form the electrode space.

In further embodiments, forming the additional lower electrode portion includes depositing a ruthenium layer in the electrode space using a physical vapor deposition (PVD) process in an oxygen free atmosphere. Forming the supporting conductor may include forming the supporting conductor of a material different from a material of the lower electrode. The lower electrode may be a noble metal, a conductive oxide of a noble metal and/or a perovskite structure conductive oxide deposited in an oxidative ambient. The supporting conductor may be a refractory metal and/or a conductive nitride deposited in a reductive (reducing) ambient. The contact plug may be doped polysilicon. Forming the lower electrode may include forming the lower electrode using chemical vapor deposition (CVD) and/or atomic layer deposition (ALD) in an oxidizing ambient.

In other embodiments, the lower electrode is a material including a noble metal and the supporting conductor is a material selected to have a higher adhesion than the material of the lower electrode to the first upper insulating layer and the lower insulating layer to limit oxidation and/or etchant damage of the contact plug during forming of the capacitor. The first upper insulating layer my be silicon nitride and/or tantalum oxide and the lower insulating layer may be silicon oxide.

In further embodiments, the upper insulating layer is a single layer and forming the opening in the upper insulating layer without exposing the contact plug includes forming a first opening in the upper insulating layer extending only partially through the upper insulating layer. Exposing the contact plug includes extending the opening in the upper insulating layer by etching to expose the contact plug and to remove an oxidation layer on an upper surface of the contact plug. Forming the capacitor dielectric layer may be preceded by etching the upper insulating layer to a height no lower than a height of a bottom surface of the lower electrode.

In yet other embodiments, forming the lower electrode includes forming a lower insulating layer on the substrate. An upper insulating layer is formed on the lower insulating layer including the contact plug. An opening is formed in the upper insulating layer. The lower electrode is formed on sidewalls of the opening in the upper insulating layer. A contact opening is formed in the lower insulating layer through the opening in the upper insulating layer. Forming the supporting conductor includes concurrently forming the contact plug in the contact opening and the supporting conductor. The lower insulating layer and the upper insulating layer may have a different etch selectivity to an etchant used for forming the opening in the upper insulating layer and in the lower insulating layer to provide a smaller diameter for the contact opening than the opening in the upper insulating layer.

In yet further embodiments of the present invention, integrated circuit devices including a capacitor are provided. The devices include an integrated circuit substrate and an insulating layer on the substrate. A contact plug extends through the insulating layer. A supporting conductor is on the contact plug. A lower electrode of the capacitor is on sidewalls of the supporting conductor and electrically connected to the contact plug by the supporting conductor. The lower electrode is a different material from the supporting conductor and a lower surface of the lower electrode has a height relative to the substrate substantially the same as an upper surface of the contact plug. A capacitor dielectric layer is on the lower electrode and an upper electrode of the capacitor is on the capacitor dielectric layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
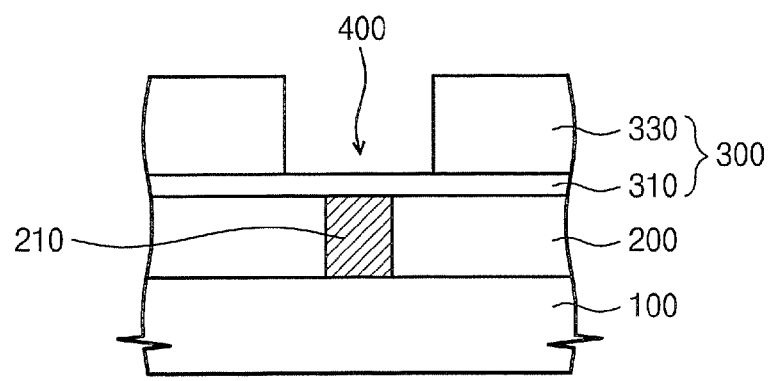
FIGS. 1 through 5 are cross-sectional views illustrating methods of forming a capacitor of an integrated circuit device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terns) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present specification and the relevant art and will not be interpreted in an idealized or overly formal sense unless expressly so defined herein.

Some embodiments of the present invention will now be described with reference to FIGS. 1-5. FIGS. 1 to 5 are cross-sectional views illustrating a method of forming a capacitor according to some embodiments of the present invention. Structures will be described herein as formed on a substrate. As used herein, the term "substrate" includes any integrated circuit structure, such as a semiconductor based structure. Such semiconductor based structures may include silicon, silicon on insulator (SOI), silicon epitaxy supported by an undoped and/or doped semiconductor structure and/or other semiconductor structures. Semiconductor structures may be, for example, silicon germanium (SiGe), germanium and/or gallium arsenide (GaAs). As used herein, a substrate may also refer to a substrate where an ion implantation process, a device isolation process, an impurity diffusion process, MOSFET process and/or a deposition process for an insulating layer and/or conducting layer is performed.

Referring first to FIG. 1, a lower insulating layer 200 is shown formed on a substrate 100. The lower insulating layer 200 may be formed, for example, of silicon oxide. Though shown as a single layer in the embodiments of FIG. 1, it will be understood that the lower insulating layer 200 may be a multi-layered structure, such as a combination of layers of silicon oxide, silicon nitride and/or the like. A contact plug 210 is illustrated that penetrates the lower insulating layer 200 and electrically connects to the substrate 100. The contact plug 210 may be formed, for example, to be electrically connected to a source/drain region of a transistor formed on the substrate 100. The contact plug 210 may be formed by patterning the lower insulating layer 200 to form a contact hole and filing a conductive material in the contact hole.

The conductive material may be filled in the contact hole by depositing a conductive material in the contact hole and on the lower insulating layer 200 and removing the portion of the conductive material outside of the contact hole while leaving a remaining portion of the conductive material in the contact hole, for example, using a planarizing process, such as chemical mechanical polishing (CMP) and/or etch-back. The conductive material may be deposited using, for example, a vapor deposition, such as chemical vapor deposition (CVD), physical vapor deposition (PVD) and/or atomic layer deposition (ALD). The process for removing the portion of the conductive material outside of the contact hole may also remove some of the conductive material in the contact hole. In some embodiments, an additional conductive material may be deposited to fill an upper part of the contact hole where conductive material was removed and, thereby, a multi-layered contact plug may be formed.

The contact plug 210, for example, may be formed of a refractory metal, a conductive metal nitride, a polycrystalline silicon, a noble metal, or a combination thereof. The refractory metal may include, for example, titanium, tungsten, tantalum and/or the like but is not limited thereto. The conductive metal nitride may include, for example, titanium nitride, tantalum nitride, tungsten nitride, zirconium nitride, hafnium nitride, titanium aluminum nitride, titanium silicon nitride, tantalum aluminum nitride, tantalum silicon nitride and/or the like but is not limited thereto.

Referring again to FIG. 1, an upper insulating layer 300 is shown formed on the lower insulating layer 200 and the contact plug 210. The upper insulating layer 300 may be formed as a single layer or a multi-layer structure. For example, the upper insulating layer 300 may be formed of a first insulating layer 310 and a second insulating layer 330. The second insulating layer 330 may have etch selectivity with respect to the first insulating layer 310.

The second insulating layer 330 may be formed, for example, of silicon oxide, and may have a thickness selected to establish the height of a capacitor electrode formed therein. The first insulating layer 310 in the illustrated embodiments covers an upper surface of the contact plug 210. The first insulating layer 310 may include one or more of the following properties: (1) preventing or limiting oxidation of the contact plug 210 during forming of a lower electrode; (2) protecting the lower insulating layer 200 when etching the second insulating layer 330 and/or; (3) good adhesion with respect to a refractory metal, a conductive metal nitride and/or a conductive oxide exhibiting perovskite structure.

The first insulating layer 310 may be formed, for example of silicon nitride but is not limited thereto. For the purposes of explanation of the present invention, embodiments will now be described with reference to exemplary embodiments where the first insulating layer 310 is formed of silicon nitride and the second insulating layer 330 is formed of silicon oxide. Using the silicon nitride first insulating layer 310 as an etching stopper, the silicon oxide second insulating layer 330 is patterned to form a first opening 400 that does not expose the contact plug 210.

Figure 2:
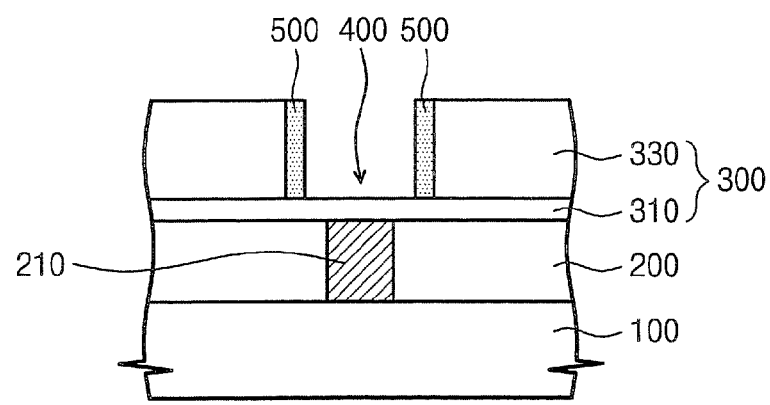

Referring now to FIG. 2, a lower electrode 500 is formed on a sidewall of the first opening 400. The lower electrode 500 may be formed of a conductive material that forms a good interface with respect to a capacitor dielectric layer. For example, the lower electrode 500 may be formed of a noble metal, a conductive oxide of a noble metal, a conductive oxide that exhibits perovskite structure or a combination thereof. The noble metal for the lower electrode 500 may include platinum (Pt), ruthenium (Ru) and/or iridium (Ir) but is not limited thereto. The conductive oxide of a noble metal for the lower electrode 500 may include platinum oxide (PtO), ruthenium oxide ($RuO_2$) and/or iridium oxide ($IrO_2$) but is not limited thereto. The conductive oxide that exhibits a perovskite structure for the lower electrode may include SrRuO3, (Ba, Sr)RuO3, CaRuO3, LSCo and/or LaNiO3, but is not limited thereto.

The lower electrode 500 may be formed, for example, by depositing a conductive material. In some embodiments the lower electrode 500 may be deposited using a vapor deposition process, such as CVD, PVD and/or ALD and the deposited conductive material may be etched back. The conductive material for the lower electrode 500 may be deposited in an oxidative ambient, such as in an oxygen gas ambient. In some embodiments of the present invention, the silicon nitride first insulating layer 310 covers the contact plug 210. As a result, as seen in FIG. 2, the contact plug 210 may not contact the lower electrode 500. Thus, even though the lower electrode 500 may be formed in an oxidative ambient, oxidation of the contact plug 210 can be limited or even prevented. A silicon nitride first insulting layer 310 may provide an effective anti-oxidation function sufficient to effectively block oxidation of the contact plug 210.

Figure 3:
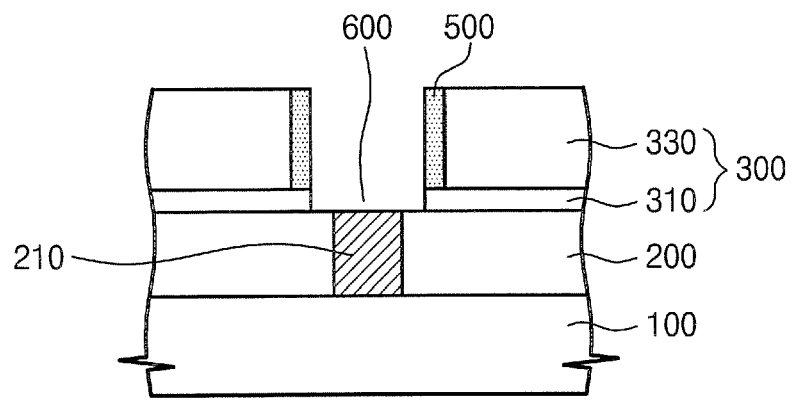

Referring next to FIG. 3, using the lower electrode 500 as an etching mask, the first insulating layer 310 in the bottom of the first opening 400 is etched to extend the first opening 400 to form a second opening 600. The silicon nitride first insulating layer 310 can be selectively etched with respect to the silicon oxide lower insulating layer 330. The diameter of the second opening 600 may be the same as the diameter of the first opening 400 or may be different therefrom. As such, reference to extending the first opening 400 to form the second opening 600 is not limited to forming the second opening 600 with a diameter substantially the same as the first opening 400 as shown in FIG. 3.

Figure 4:
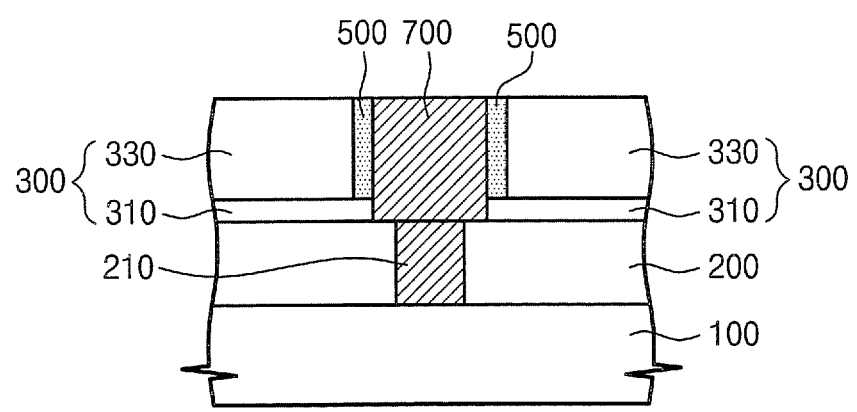

As shown in FIG. 4, the first 400 and second 600 openings are filled with a conductive material to form a supporting conductor 700 that is electrically connected to the lower electrode 500 and the contact plug 210. As a result, the supporting conductor 700 serves to electrically connect the lower electrode 500 and the contact plug 210. In some embodiments, the supporting conductor 700 is formed by depositing a conductive material in the first 400 and second 600 openings and on the second insulating layer 330 and a planarizing process, such as CMP and/or etch-back, is used to remove conductive material deposited on an upper surface of the second insulating layer 330. The conductive material for the supporting conductor 700 may be deposited, for example, by a vapor deposition, such as CVD, PVD, ALD and/or the like. The deposition may occur in a reductive (reducing) ambient so as limit or even prevent to oxidization of the contact plug 210 during the deposition process. The reductive ambient may include, for example, a hydrogen gas ambient and/or an ammonia gas ambient. The reductive ambient may also include a reacting gas that does not include oxygen.

In some embodiments, the supporting conductor 700 is formed of a thermally stable material that exhibits good adhesion with respect to the lower insulating layer 200. For example, the conductive material for the supporting conductor 700 may include a refractory metal, a conductive nitride or a combination thereof. A refractory metal for the supporting conductor 700 may include, for example, titanium, tungsten, tantalum and/or the like but is not limited thereto. A conductive metal nitride for the supporting conductor 700 may include, for example, titanium nitride, tantalum nitride, tungsten nitride, zirconium nitride, hafnium nitride, titanium aluminum nitride, titanium silicon nitride, tantalum aluminum nitride, tantalum silicon nitride and/or the like but is not limited thereto.

Figure 5:
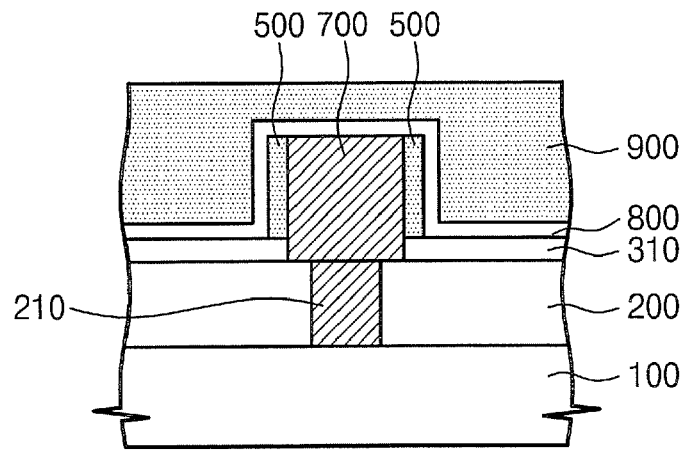

Referring next to FIG. 5, the silicon oxide second insulating layer 330 is removed to expose the lower electrode 500. The second insulating layer 330 can be selectively removed with respect to the silicon nitride first insulating layer 310, for example, by using a suitable etchant, such as a wet etching solution and/or a dry etching gas. Because the silicon nitride first insulating layer 310 may exhibit a good adhesion with respect to the supporting conductor 700, deterioration of the contact plug 210 by the etchant used for removing the second insulating layer 330 may be limited or even prevented.

As further seen in the embodiments of FIG. 5, a capacitor dielectric 800 and an upper electrode 900 are formed to complete the layers of a capacitor. The capacitor dielectric layer 800 can be formed of a high dielectric material, for example, by CVD and/or ALD. The capacitor dielectric layer 800 may be formed of an insulating material that exhibits a perovskite structure and/or an insulating metal oxide.

A suitable insulating material for the capacitor dielectric layer 800 that exhibits a perovskite structure may include, for example, (Ba, Sr)TiO$_3$, SrTiO$_3$, BaTiO$_3$, PbTiO$_3$, Pb(Zr, Ti)O$_3$, SrBi$_2$Ta$_2$O$_9$, (Pb, La)(Zr, Ti)O$_3$ and/or Bi$_4$Ti$_3$O$_{12}$ but is not limited thereto. A suitable insulating metal oxide for the capacitor dielectric layer 800 may include, for example, Ta$_2$O$_5$, Ta$_2$O$_5$N, Al$_2$O$_5$, HfO$_2$, ZrO$_2$ and/or TiO$_2$ but is not limited thereto. The upper electrode 900 may be formed of a noble metal, a conductive oxide of a noble metal, a conductive oxide that exhibits a perovskite structure, a refractory metal, a conductive metal nitride or a combination thereof. The upper electrode 900 may be formed using, for example, a vapor deposition process, such as CVD, PVD and/or ALD.

A noble metal for the upper electrode 900 may include, for example, platinum (Pt), ruthenium (Ru) and/or iridium (Ir) but is not limited thereto. A conductive oxide of a noble metal for the upper electrode 900 may include, for example, platinum oxide (PtO), ruthenium oxide (RuO$_2$) and/or iridium oxide (IrO$_2$) but is not limited thereto. A conductive oxide that exhibits a perovskite structure for the upper electrode may include, for example, SrRuO$_3$, (Ba, Sr)RuO$_3$, CaRuO$_3$, LSCo and/or LaNiO$_3$ but is not limited thereto. A conductive oxide of a noble metal for the lower electrode 500 may include, for example, platinum oxide (PtO), ruthenium oxide (RuO$_2$) and/or iridium oxide (IrO$_2$) but is not limited thereto.

A refractory metal for the upper 900 may include, for example, titanium, tungsten, tantalum and/or the like but is not limited thereto. A conductive metal nitride for the upper electrode 900 may include, for example, titanium nitride, tantalum nitride, tungsten nitride, zirconium nitride, hafnium nitride, titanium aluminum nitride, titanium silicon nitride, tantalum aluminum nitride, tantalum silicon nitride and/or the like but is not limited thereto.

Figure 6:
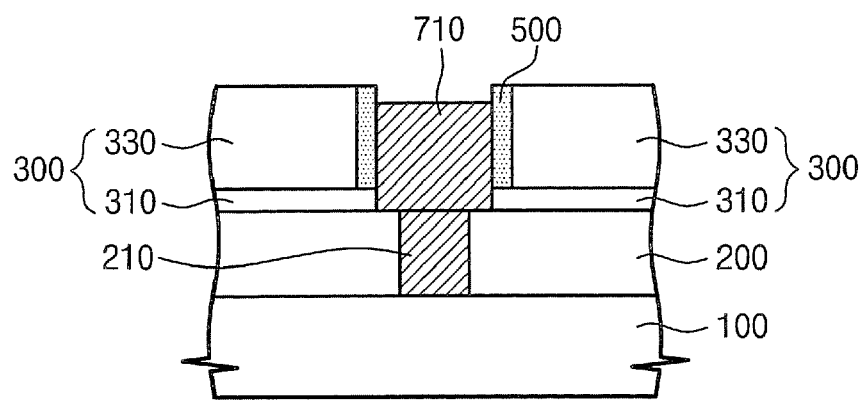
FIGS. 6 and 7 are cross-sectional views illustrating methods of forming a capacitor of an integrated circuit device according to some embodiments of the present invention.
Figure 7:
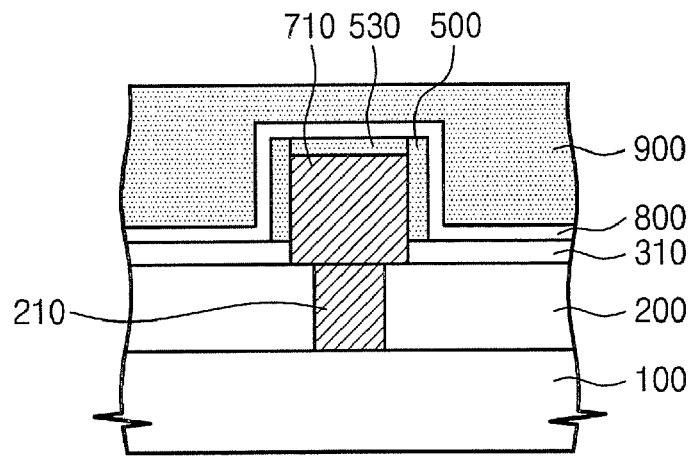

Referring now to FIGS. 6 to 7, further embodiments of the present invention will be described. More particularly, as discussed above, the lower electrode 500 and the supporting conductor 700 may be different materials. For example, the lower electrode 500 may be a noble metal and the supporting conductor 700 may be a refractory metal. As seen in the embodiments of FIG. 5, the capacitor dielectric layer 800 may contact both of these distinct materials, rather than just contacting the noble metal lower electrode 500, which may degrade the performance of the capacitor. As such, the embodiments of FIGS. 6 to 7 differ from the embodiments described with reference to FIGS. 1 to 5 in that a lower electrode is also formed on an upper surface of a supporting conductor as will now be described.

Where not otherwise noted, operations for like numbered elements of FIGS. 6 to 7 may be substantially the same as previously described with reference to FIGS. 1 to 5, which details need not be repeated herein. More particularly, for the embodiments of FIGS. 6 to 7, the lower insulating layer 200, the contact plug 210, the silicon nitride first insulating layer 310, the silicon oxide second insulating layer 330, the first opening 400, the lower electrode 500, the second opening 600 (and depositing of a conductive material to form a supporting conductor 700. 710) may be formed on the substrate 100 by processes substantially as described with reference to FIGS. 1 to 5.

As seen in the embodiments of FIG. 6, a supporting conductor 710 that has a top surface lower than a top surface of a second insulating layer of a silicon nitride 330 is formed in the first 400 and second 600 openings. While the supporting conductor 710 may be formed substantially as described with reference to the supporting conductor 700 of FIG. 5, additional etching and/or the like may be performed to lower the upper surface of the supporting conductor 710 as shown in FIG. 6. In other words, the silicon oxide second insulating layer 330 may be exposed, a planarizing process may be performed and then additional etching may be performed to form the supporting conductor 710 having a top surface lower than a top surface of the silicon oxide second insulating layer 330.

While described above with reference to additional etching or the like to form the supporting conductor with the lower top surface, such additional etching is not required in some embodiments. For example, in some embodiments, the capacitor is located in a cell area of an integrated circuit memory device and the integrated circuit memory device also includes a peripheral area. The supporting conductor 710 is formed to a height lower than an upper surface of the lower electrode by depositing a material layer of the material of an additional lower electrode portion 530 (FIG. 7) on the upper insulating layer 330 and the supporting conductor 710 in the cell area and on an insulating layer in the peripheral area. It will be understood that, due to differences of features formed in the respective areas, a thickness of the material layer is less on the cell area than on the peripheral area. The deposited material layer is etched back to expose the insulating layer of the peripheral area and the upper insulating layer in the cell area and to form the electrode space. In other words, the electrode space may be provided as a result of underlying feature differences in the thickness of the deposited layer and a comparatively uniform thickness being removed by the subsequent etch back process. Note that such a result may not be provided if CMP or the like is used instead of an etch back process.

Referring now to the embodiments illustrated in FIG. 7, a conductive material that will be used to form the additional lower electrode 530 may be deposited on the supporting conductor 700, the lower electrode 500 and the second insulating layer 330. The deposited conductive material may then be planarized by an etching process, such as CMP, and etchback may be performed to form the additional lower electrode 530. The additional lower electrode 530 is shown electrically connected to the lower electrode 500 and the supporting conductor 710. The conductive material for the additional lower electrode 530 may be a same material as the lower electrode 500.

In some embodiments, a PVD process may be used to deposit, for example, ruthenium, so as to form the additional lower electrode 530 with limited or no oxidation. In contrast, the lower electrode 500 may be deposited using an ALD and/or CVD process in an oxygen atmosphere. The PVD process for the additional lower electrode 530 may reduce the risk of oxidation between the supporting conductor 710 and the additional lower electrode 530.

After removing the second insulating layer 330, a capacitor dielectric layer 800 and an upper electrode 900 are shown formed in the embodiments of FIG. 7. As such, the additional lower electrode 530 is interposed between the supporting conductor 710 and the capacitor dielectric layer 800. In contrast, for the embodiments illustrated in FIGS. 1 to 5, the capacitor dielectric layer 800 is in contact with an upper surface of the supporting conductor 700.

Figure 8:
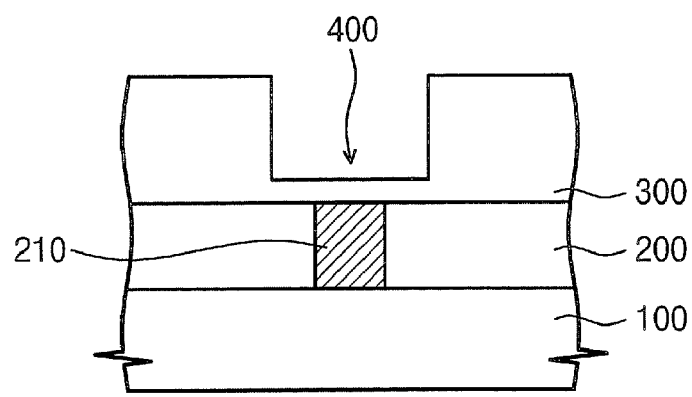
FIGS. 8 through 10 are cross-sectional views illustrating methods of forming a capacitor of an integrated circuit device according to other embodiments of the present invention.
Figure 9:
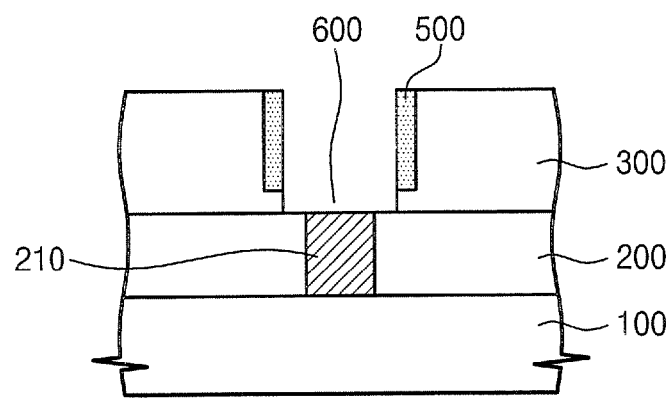
Figure 10:
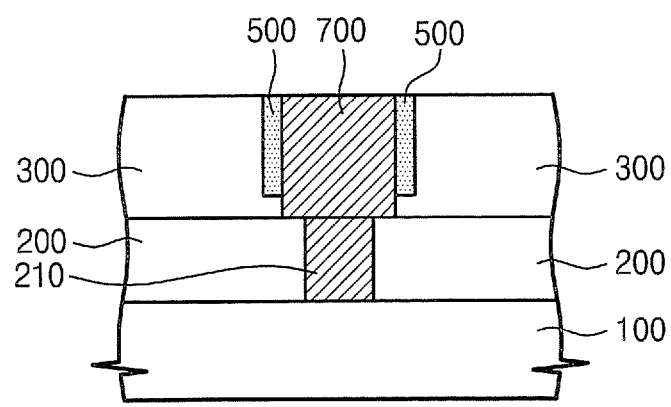

Referring now to FIGS. 8 to 10, further embodiments of the present invention will be described. For the embodiments of FIGS. 8 to 10, the upper insulating layer 300 is formed of a single layer rather than the multi-layer structure described previously.

Referring to FIG. 8, after forming the lower insulating layer 200 having the contact plug 210 on the substrate 100, an upper insulating layer 300 is formed on the lower insulating layer 200 and the contact plug 210. The upper insulating layer 300 is formed of a single layer of, for example, silicon oxide. A partial thickness of the upper insulating layer 300 is patterned to form a first opening 400 for defining a lower electrode. In other words, the first opening 400 has a depth selected that does not result in exposure of the underlying contact plug 210.

As shown in FIG. 9, the lower electrode 500 may be formed on a sidewall of the first opening 400 using a process substantially similar to that described previously with reference to FIGS. 1 to 7. Using the lower electrode 500 as an etching mask, a remaining portion of the upper insulating layer 300 at the bottom of the first opening 400 is removed to form a second opening 600, which exposes the contact plug 210. Removing the remaining portion of the upper insulating layer 300 may further remove any oxidation layer that may be present on an upper surface of the contact plug 210. As a result, the partial thickness of the upper insulating layer 300 shown in FIG. 8 may not need to be thick enough to assure no oxidation occurs as, if a limited amount of oxidation of the contact plug 210 occurs during formation of the lower electrode 500, it may be removed during formation of the second opening 600.

Referring now to FIG. 10, a supporting conductor 700 is shown formed in the first 400 and second 600 opening that is electrically connected to the contact plug 210 and to the lower electrode 500. While not shown in FIG. 10, after removing the upper insulating layer 300, a capacitor dielectric layer 800 and an upper electrode 900 may be formed substantially as described with reference to FIG. 5.

For the embodiments illustrated in FIG. 10 a portion of the upper insulating layer may be retained during the removal process thereof that covers a lower side surface of the lower electrode 500. In other words, removing the upper insulating layer 300 may be performed such that a portion of the upper insulating layer remains between the lower insulating layer 200 and a lower surface of the lower electrode 500, which remaining portion may provide support for the lower electrode 500. In some embodiments, the remaining portion is provided by time limited etching to a selected depth of the upper insulating layer 300 and the remaining portion remains under the lower electrode 500 and extending along the lower insulating layer 200.

Referring now to FIGS. 11 to 15, still further embodiments of the present invention will be described. For the embodiments illustrated in FIGS. 11 to 15, a contact plug and a supporting conductor are formed concurrently. As used herein "a contact plug and a supporting conductor are formed concurrently" may include forming of the contact plug and the supporting conductor using a single deposition of a conductive material.

Figure 11:
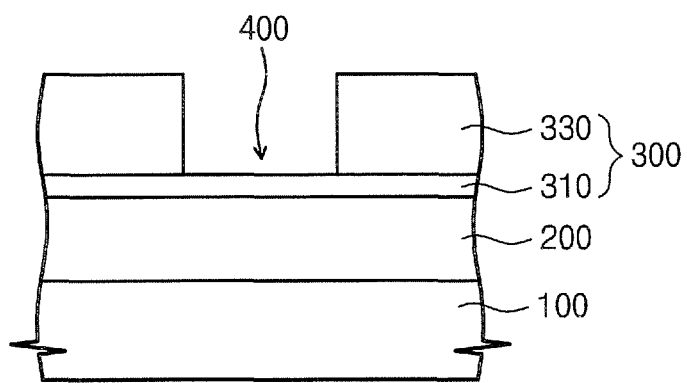
FIGS. 11 through 15 are cross-sectional views illustrating methods of forming a capacitor of an integrated circuit device according to further embodiments of the present invention.

Referring first to FIG. 11, the lower insulating layer 200 and the upper insulating layer 300 are formed on the substrate 100. The upper insulating layer 300 may be formed of a first layer 310 of a silicon nitride and a second layer 330 of a silicon oxide. The silicon oxide second layer 330 is shown patterned to form the first opening 400 in FIG. 11.

Figure 12:
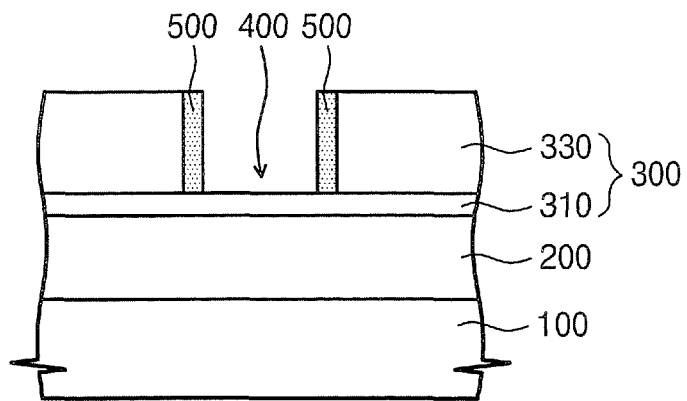
Figure 13:
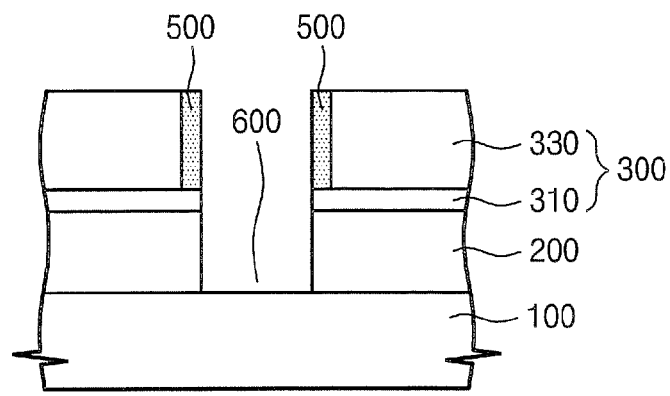

Referring next to FIG. 12, the lower electrode 500 may be formed on a sidewall of the first opening 400 by substantially the same method as described previously with reference to FIG. 3. As seen in FIG. 13, using the lower electrode 500 as an etching mask, the silicon nitride first layer 310 and the lower insulating layer 200 under the bottom of the first opening 400 may be etched to form a second opening 600 that exposes a portion of the substrate 100. For example, a transistor may be formed on the substrate 100 and the second opening 600 may expose a source/drain region of the transistor. A gate of the transistor may be protected during the etching process used to form the second opening 600 by, for example, providing a silicon nitride layer on a sidewall and a top surface of the gate.

In some embodiments, the lower insulating layer 200 and the upper insulating layer 300 have a different etch selectivity to an etchant used for forming the respective openings 400, 600 in the upper insulating layer 300 and in the lower insulating layer 200. This may provide a smaller diameter for the contact opening 600 than the opening 400 in the upper insulating layer 330. As such, a smaller feature, such as a source/drain region of a highly integrated memory device of the like, may be contacted without requiring as great of a contact area receiving a conductive material deposited in the opening 600.

Figure 14:
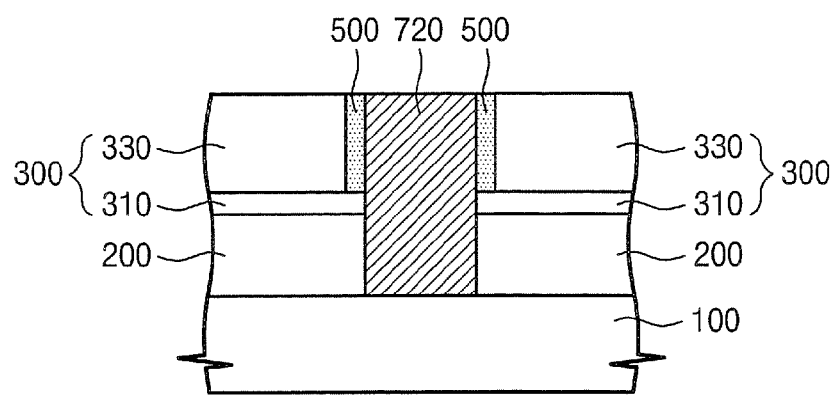
Figure 15:
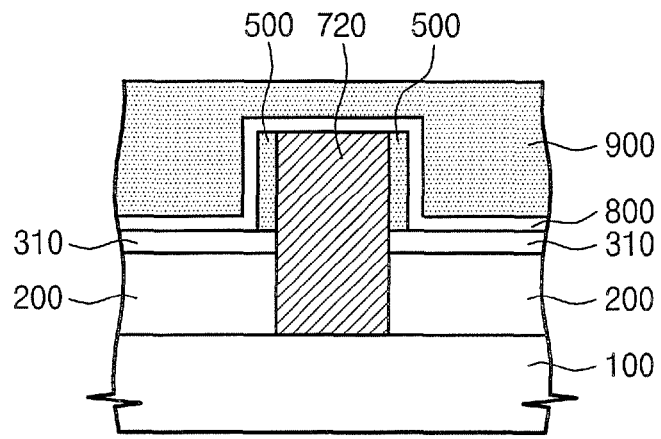

As seen in FIG. 14, a supporting conductor 720 is formed in the first and second openings that is electrically connected to the lower electrode 500. Referring to FIG. 15, after removing the silicon oxide 330, a capacitor dielectric layer 800 and an upper electrode 900 may be formed.

Figure 16:
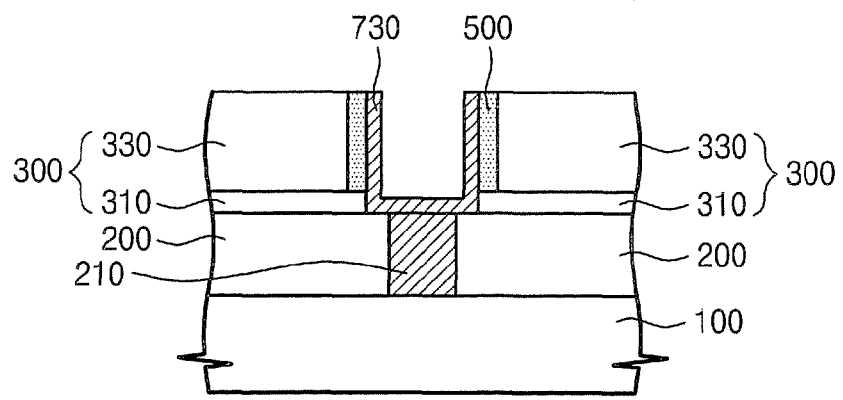
FIGS. 16 and 17 are cross-sectional views illustrating methods of forming a capacitor of an integrated circuit device according to other embodiments of the present invention.
Figure 17:
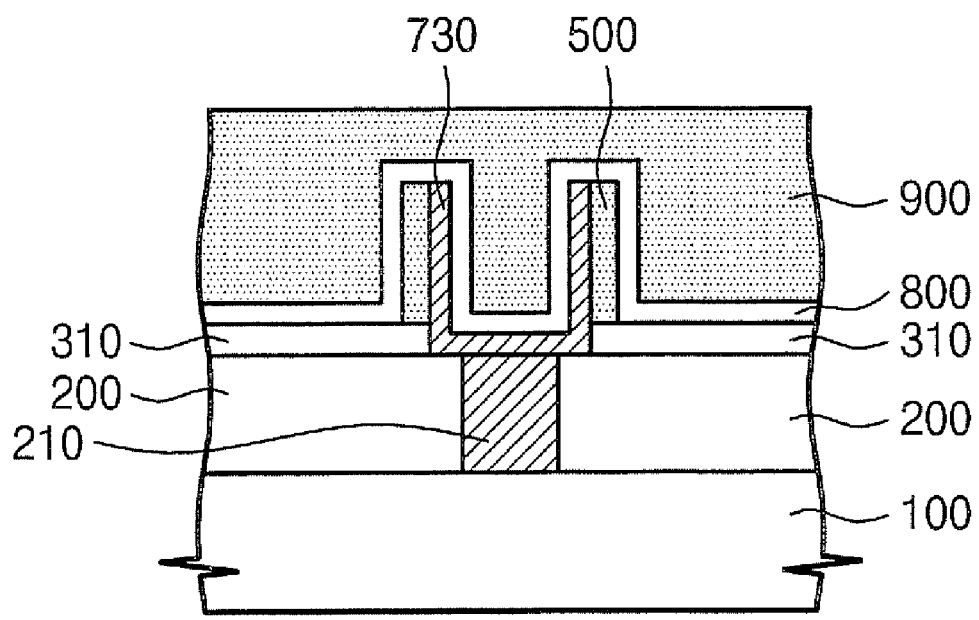

Note that a box type supporting conductor 700, 710, 720 is illustrated in the above figures for exemplary purpose. Various shapes of the supporting conductor, such as cylindrical supporting conductor, can be formed, as will be described with reference to FIGS. 16 and 17. After performing processes substantially as described above with reference to FIGS. 1 to 3, a conformal conductive layer is formed in the first and second openings as shown in the embodiments of FIG. 16. A CMP process or the like may be carried out to remove a portion of the conformal conductive layer outside of the first and second opening, thereby forming a cylindrical supporting conductor 730. As seen in FIG. 17, after removing the silicon oxide 330, a capacitor dielectric layer 800 and an upper electrode 900 may be formed. In the embodiments of FIG. 17, the dielectric layer 800 may be formed of a thicker and/or high-k (dielectric constant) film and a greater capacitor area may compensate for loss of capacitance due to the thicker layer.

As described above, in some embodiments of the present invention, after the lower electrode is formed of a conductive material, such as a noble metal, the contact plug is exposed. Thus, exposure of the contact plug to an oxidative ambient used for forming the lower electrode may be avoided. In some embodiments, the contact plug is protected by an anti-oxidation layer, such as a silicon nitride, when forming the lower electrode. Thus, oxidation of the contact plug may be limited or even prevented. In some embodiments, the supporting conductor exhibits good adhesion to the first insulating layer, such as a silicon nitride first insulating layer. As such, etchant attacks on the contact plug when removing the silicon oxide second insulating layer using the etchant may be limited or even prevented.

Thus in some embodiments of the present invention, oxidation of the contact plug may be limited or even prevented. As a result, more flexibility may be provided in selecting a conductive material for the contact plug without being as restrained by oxidation properties of the conductive material. For example, not only refractory metals or conductive metal nitrides may be used but materials such as polycrystalline silicon, which has a good interface characteristics with respect to an active region of a substrate, may also be used in some embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a capacitor of an integrated circuit device, comprising:
    forming a lower electrode of the capacitor on an integrated circuit substrate without exposing a contact plug to be coupled to the lower electrode;
    forming a supporting conductor coupling the lower electrode to the contact plug after forming the lower electrode;
    forming a capacitor dielectric layer on the lower electrode; and
    forming an upper electrode of the capacitor on the capacitor dielectric layer,
    wherein forming the capacitor dielectric layer is preceded by forming an additional lower electrode portion covering an upper surface of the supporting conductor, the additional lower electrode portion comprising a different material from the supporting conductor, and wherein forming the capacitor dielectric layer includes forming the capacitor dielectric layer on the additional lower electrode portion, and wherein the lower electrode includes a conductive material and wherein the lower electrode comprises a noble metal, a conductive oxide of a noble metal and/or a perovskite structure conductive oxide deposited in an oxidative ambient and wherein the supporting conductor comprises a refractory metal and/or a conductive nitride deposited in a reductive ambient.

2. The method of claim 1, wherein forming the lower electrode comprises:
    forming a lower insulating layer on the substrate;
    forming a contact hole through the lower insulating layer;
    forming the contact plug in the contact hole;
    forming an upper insulating layer on the lower insulating layer including the contact plug;
    forming an opening in the upper insulating layer over the contact plug without exposing the contact plug;
    forming the lower electrode on sidewalls of the opening in the upper insulating layer; and
    exposing the contact plug by extending the opening in the upper insulating layer after forming the lower electrode.

3. The method of claim 2, wherein forming a supporting conductor comprises forming the supporting conductor to a height lower than an upper surface of the lower electrode to provide an electrode space and wherein forming the additional lower electrode portion comprises forming the additional lower electrode portion in the electrode space and contacting the lower electrode formed on the sidewalls of the opening in the upper insulating layer.

4. The method of claim 3, wherein forming the supporting conductor to a height lower than an upper surface of the lower electrode comprises:
    depositing a material layer of the material of the supporting conductor on the upper insulating layer and the supporting conductor;

polishing the deposited material layer to expose the upper insulating layer; and then etching the polished supporting conductor to form the electrode space.

5. The method of claim 3, wherein forming the additional lower electrode portion comprises depositing a ruthenium layer in the electrode space using a physical vapor deposition (PVD) process in an oxygen free atmosphere.

6. The method of claim 1, wherein forming the supporting conductor comprises forming the supporting conductor of a material different from a material of the lower electrode.

7. The method of claim 3, wherein the lower electrode comprises a material including a noble metal and wherein the supporting conductor comprises a material selected to have a higher adhesion than the material of the lower electrode to the first upper insulating layer and the lower insulating layer to limit oxidation and/or etchant damage of the contact plug during forming of the capacitor:

8. The method of claim 7, wherein the first upper insulating layer comprises silicon nitride and/or tantalum oxide and the lower insulating layer comprises silicon oxide.

9. The method of claim 1, wherein the contact plug comprises doped polysilicon.

10. The method of claim 1, wherein forming the lower electrode comprises forming the lower electrode using chemical vapor deposition (CVD) and/or atomic layer deposition (ALD) in an oxidizing ambient.

11. A method of forming a capacitor of an integrated circuit device, comprising:

forming a lower electrode of the capacitor on an integrated circuit substrate without exposing a contact plug to be coupled to the lower electrode;

forming a supporting conductor coupling the lower electrode to the contact plug after forming the lower electrode;

forming a capacitor dielectric layer on the lower electrode; and forming an upper electrode of the capacitor on the capacitor dielectric layer, wherein forming the capacitor dielectric layer is preceded by forming an additional lower electrode portion covering an upper surface of the supporting conductor, the additional lower electrode portion comprising a different material from the supporting conductor, and wherein forming the capacitor dielectric layer includes forming the capacitor dielectric layer on the additional lower electrode portion, wherein forming a supporting conductor comprises forming the supporting conductor to a height lower than an upper surface of the lower electrode to provide an electrode space and wherein forming the additional lower electrode portion comprises forming the additional lower electrode portion in the electrode space and contacting the lower electrode formed on the sidewalls of the opening in the upper insulating layer, wherein the capacitor is located in a cell area of the integrated circuit device and wherein the integrated circuit device also includes a peripheral area and wherein forming the supporting conductor to a height lower than an upper surface of the lower electrode comprises:

depositing a material layer of the material of the additional lower electrode portion on an upper insulating layer of the integrated circuit device and the supporting conductor in the cell area and on an insulating layer in the peripheral area, where a thickness of the material layer is less on the cell area than on the peripheral area; and etching back the deposited material layer to expose the insulating layer of the peripheral area and the upper insulating layer in the cell area and to form the electrode space.

* * * * *

UNITED STATES PATENT AND TRADEMARK OFFICE
CERTIFICATE OF CORRECTION

| | | |
|---|---|---|
| PATENT NO. | : 8,318,560 B2 | Page 1 of 1 |
| APPLICATION NO. | : 11/680148 | |
| DATED | : November 27, 2012 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 843 days.

Signed and Sealed this
Nineteenth Day of August, 2014

Michelle K. Lee
*Deputy Director of the United States Patent and Trademark Office*